US010236832B1

United States Patent
Jheng et al.

(10) Patent No.: US 10,236,832 B1
(45) Date of Patent: Mar. 19, 2019

(54) AUDIO SYSTEM

(71) Applicant: Airoha Technology Corp., Hsinchu (TW)

(72) Inventors: Jia-An Jheng, Taoyuan (TW); Yu-Hua Liu, Hsinchu County (TW); Ya-Ling Yang, Zhubei (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 16/014,053

(22) Filed: Jun. 21, 2018

(30) Foreign Application Priority Data

Dec. 12, 2017 (TW) ............................... 106143622 A

(51) Int. Cl.
*H03F 1/30* (2006.01)
*H04R 3/00* (2006.01)
*H03F 3/187* (2006.01)

(52) U.S. Cl.
CPC ............ *H03F 1/305* (2013.01); *H03F 3/187* (2013.01); *H04R 3/007* (2013.01); *H03F 2200/03* (2013.01)

(58) Field of Classification Search
None
See application file for complete search history.

(56) References Cited

U.S. PATENT DOCUMENTS

| 7,932,711 | B2 | 4/2011 | Ishizuka et al. | |
|---|---|---|---|---|
| 8,965,010 | B2 | 2/2015 | Sorace et al. | |
| 9,014,396 | B2 | 4/2015 | Miao | |
| 2014/0079249 | A1* | 3/2014 | Chen | H03F 1/305 381/120 |
| 2014/0294204 | A1* | 10/2014 | Lin | H03F 3/181 381/120 |
| 2018/0278217 | A1* | 9/2018 | Akebono | H03F 3/45071 |

* cited by examiner

*Primary Examiner* — Joshua Kaufman
*Assistant Examiner* — Kenny H Truong
(74) *Attorney, Agent, or Firm* — McClure, Qualey & Rodack, LLP

(57) ABSTRACT

An audio system includes a reference voltage generation circuit to generate a digital encoding signal and generate an analog reference voltage according to the digital encoding signal, wherein, during a booting procedure and/or a shutdown procedure, the analog reference voltage is smoothly increased and/or decreased at a smooth rate related to a bit number of the digital encoding signal; a first analog operational amplifier for receiving the analog reference voltage to generate a common voltage, which is smoothly increased and/or decreased during the booting procedure and/or the shutdown procedure; and a differential analog operational amplifier pair, coupled to the first analog operational amplifier, for receiving a differential audio input signal pair and outputting a differential output voltage pair to drive a load, wherein, during the booting procedure and/or the shutdown procedure, the differential audio output signal pair is smoothly increased and/or decreased.

6 Claims, 4 Drawing Sheets

US 10,236,832 B1

AUDIO SYSTEM

This application claims the benefit of Taiwan application Serial No. 106143622, filed Dec. 12, 2017, the subject matter of which is incorporated herein by reference.

BACKGROUND OF THE INVENTION

Field of the Invention

The invention relates in general to an audio system.

Description of the Related Art

In many audio systems, the output end is coupled to the speaker through a capacitor. Before the audio system is shut down, the capacitor normally has a cross voltage of 0 v. After the audio system is booted, the capacitor will be charged to a required DC level.

However, due to the instant rise in the cross voltage of the capacitor during the charging process of the capacitor, the speaker may generate pop noises. Similarly, due to the instant drop in the cross voltage of the capacitor during the shutdown procedure of the audio system, the speaker also may generate pop noises which are indeed annoying noises to the users.

Therefore, an audio system capable of reducing pop noises is provided in the present disclosure.

SUMMARY OF THE INVENTION

The invention is directed to an audio system including a reference voltage generation circuit, a first analog operational amplifier, and a differential analog operational amplifier pair is provided. The reference voltage generation circuit is configured to generate a digital encoding signal and generate an analog reference voltage according to the digital encoding signal, wherein, during a booting procedure and/or a shutdown procedure, the analog reference voltage is smoothly increased and/or decreased at a smooth rate related to a bit number of the digital encoding signal. The first analog operational amplifier is coupled to the reference voltage generation circuit for receiving the analog reference voltage to generate a common voltage, wherein during the booting procedure and/or the shutdown procedure, the common voltage is smoothly increased and/or decreased. The differential analog operational amplifier pair is coupled to the first analog operational amplifier to receive the common voltage generated by the first analog operational amplifier for receiving a differential audio input signal pair and outputting a differential output voltage pair to drive a load, wherein during the booting procedure and/or the shutdown procedure, the differential audio output signal pair is smoothly increased and/or decreased. During the booting procedure and/or the shutdown procedure, according to smooth increase or smooth decrease of the analog reference voltage between a first reference level and a second reference level, a plurality of bias circuits of the differential analog operational amplifier pair are transited between being short-circuited to each other and being disconnected from each other.

The above and other contents of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present disclosure has one or more technical characteristics. Given that each embodiment is implementable, a person ordinarily skilled in the art can selectively implement or combine some or all of the technical characteristics of any embodiment of the present disclosure.

Figure 1:
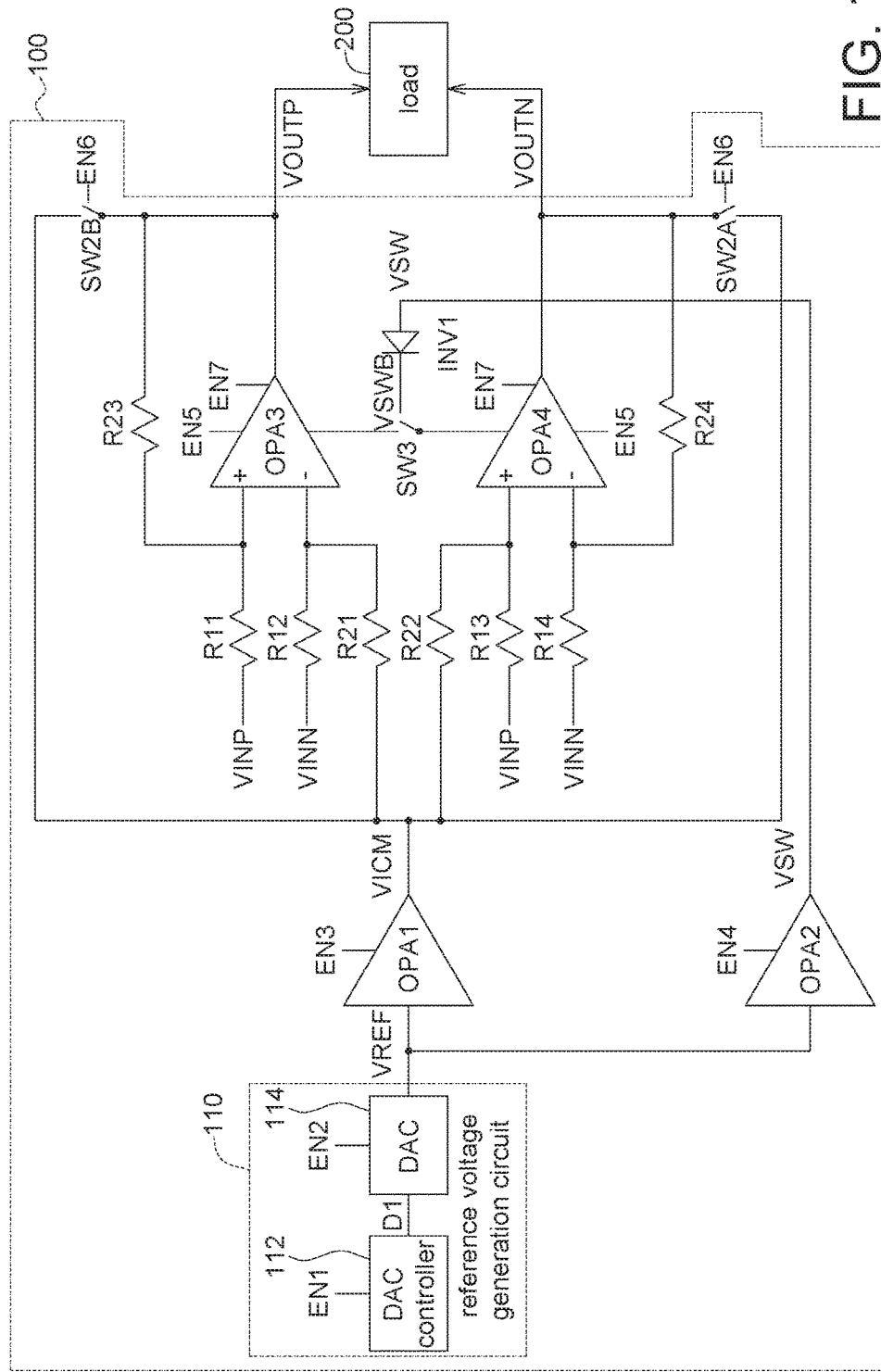
FIG. 1 shows a block diagram of an audio system according to an embodiment of the present disclosure.
Figure 2:
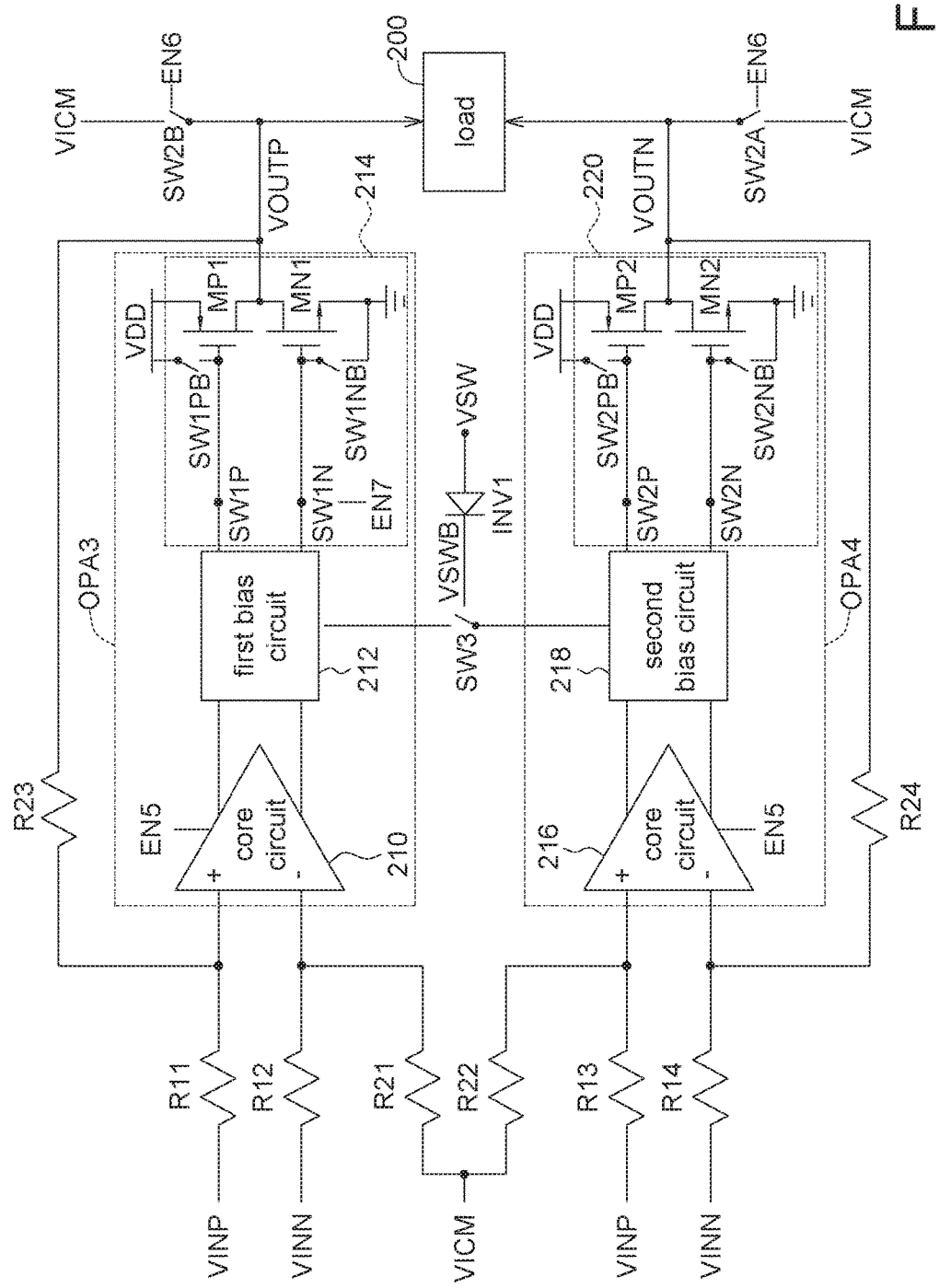
FIG. 2 shows a circuit architecture of an audio system according to an embodiment of the present disclosure.
Figure 3:
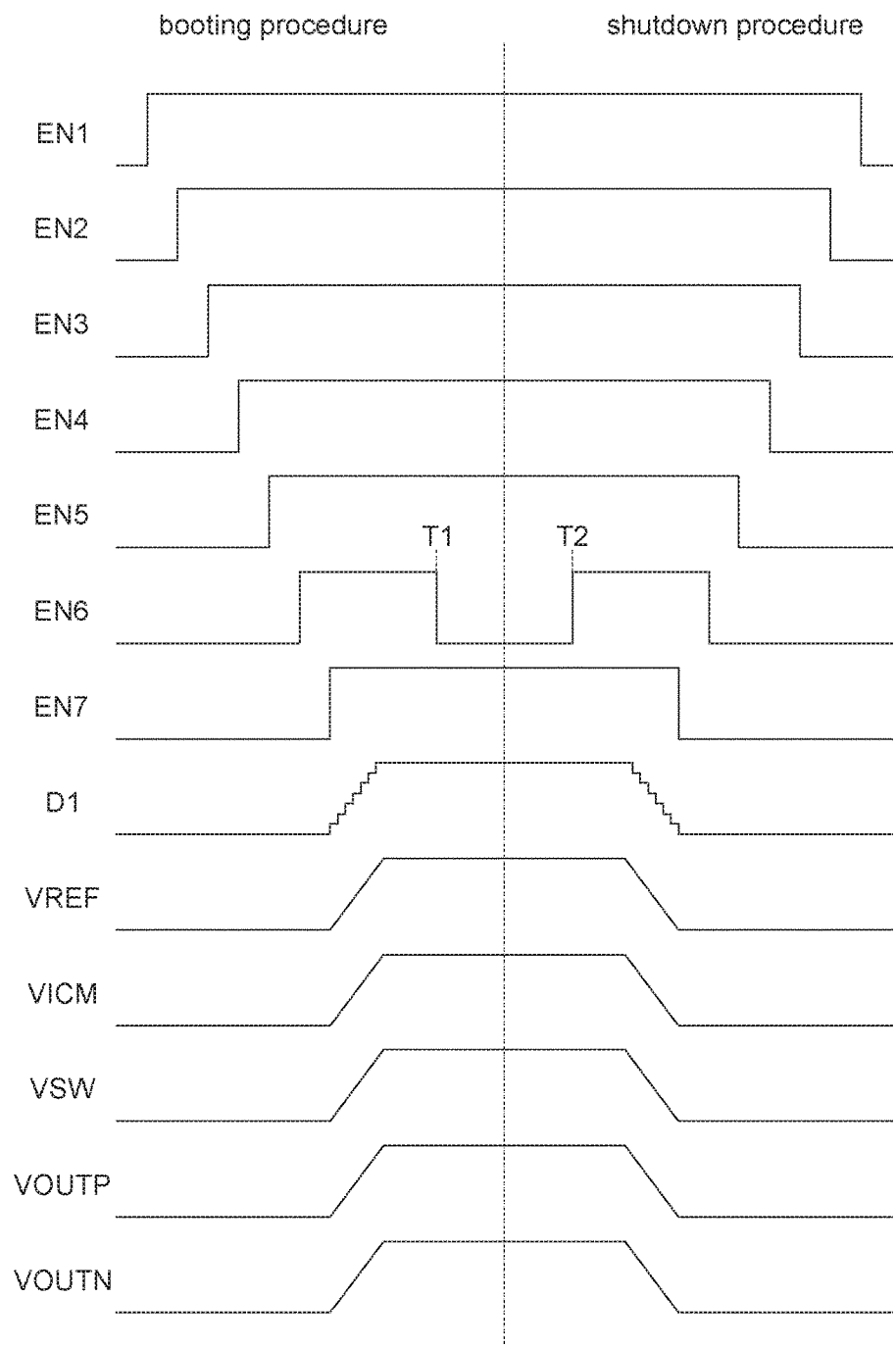
FIG. 3 shows a signal wave-pattern of an audio system according to an embodiment of the present disclosure.

FIG. 1 shows a block diagram of an audio system according to an embodiment of the present disclosure. FIG. 2 shows a circuit architecture of an audio system according to an embodiment of the present disclosure. FIG. 3 shows a signal wave-pattern of an audio system according to an embodiment of the present disclosure.

As indicated in FIG. 1, the audio system 100 according to an embodiment of the present disclosure drives a load 200. The load 200 is a soundable device (for example a speaker) which includes a passive circuit element. The passive circuit element may be realized by a resistor, a capacitor or an inductor.

The audio system 100 includes a reference voltage generation circuit 110, analog operational amplifiers OPA1-OPA4, a phase inverter INV1, resistors R11-R24 and switches SW2A, SW2B and SW3. The reference voltage generation circuit 110 includes a digital analog converter (DAC) controller 112 and a digital analog converter (DAC) 114. The analog operational amplifiers OPA3-OPA4 are also referred as differential analog amplifier pair.

To simplify the illustration, some elements of FIG. 1 (such as the reference voltage generation circuit 110 and the analog operational amplifiers OPA1-OPA2) are not illustrated in FIG. 2. However, it is understood from FIG. 1 and FIG. 2 that the common voltage VICM is provided by the analog operational amplifier OPA1.

As indicated in FIG. 2, the analog operational amplifier OPA3 includes a core circuit 210, a first bias circuit 212 and an output stage 214 (which includes switches SW1P, SW1N, SW1PB and SW1NB and MOS transistors MP1 and MN1). Similarly, the analog operational amplifier OPA4 includes a core circuit 216, a second bias circuit 218 and an output stage 220 (which includes switches SW2P, SW2N, SW2PB and SW2NB and MOS transistors MP2 and MN2).

The operating principles of the audio system 100 are disclosed below with accompanying drawings FIG. 1 to FIG. 3.

The digital encoding signal D1 outputted by the digital analog converter controller 112 may control the digital analog converter 114. The on/off state of the digital analog converter controller 112 is controlled by the control signal EN1. The digital encoding signal D1 may be monotonically decreased or increased, such that the analog reference voltage VREF outputted by the digital analog converter 114 may be smoothly increased or decreased. The larger the bit number of the digital encoding signal D1, the finer the change in the step voltage of the analog reference voltage VREF. That is, the analog reference voltage VREF is smoothly increased and/or decreased at a smooth rate which is related to the digital encoding signal D1.

Exemplarily but not restrictively, the relationship between the digital encoding signal D1 and the analog reference voltage VREF is as follows (exemplarily but not restrictively, the digital encoding signal D1 has 10 bits and the analog reference voltage VREF has a maximum of 1V, then each digital encoding signal has a voltage of about 1 mV):

| Digital encoding signa D1 | Analog reference voltage VREF |
|---|---|
| 0000000000 | 0 V |
| 0000000001 | 1 mV |
| 0000000010 | 2 mV |
| ... | ... |
| 1111111111 | Maximum (such as 1 V) |

The digital analog converter 114 is coupled to the digital analog converter controller 112. The digital analog converter 114 is controlled by the digital encoding signal D1 outputted by the digital analog converter controller 112 to output an analog reference voltage VREF to the analog operational amplifier OPA1 and OPA2. The on/off state of the digital analog converter 114 is controlled by the control signal EN2.

The analog operational amplifier OPA1 is coupled to the digital analog converter 114. The digital analog converter 114 generates and provides an analog reference voltage VREF for the analog operational amplifier OPA1 to generate a common voltage VICM. The common voltage VICM may be used as a direct current bias voltage of the audio system 100 and may be smoothly increased or decreased. The analog operational amplifier OPA1 has a voltage follow function, and may dynamically adjust the common voltage VICM according to actual application. The on/off state of the analog operational amplifier OPA1 is controlled by the control signal EN3.

The analog operational amplifier OPA2 is coupled to the digital analog converter 114. The digital analog converter 114 generates and provides an analog reference voltage VREF for the analog operational amplifier OPA2 to generate a switch control voltage VSW. During the booting procedure of the audio system 100, the switch control voltage VSW may be smoothly increased or decreased. The switch control voltage VSW is inverted to an inverse switch control voltage VSWB by the phase inverter INV1. The inverse switch control voltage VSWB may be used for controlling the ON/OFF state of the switch SW3. The on/off state of the analog operational amplifier OPA2 is controlled by the control signal EN4.

The analog operational amplifiers OPA3 and OPA4 are coupled to the analog operational amplifier OPA1. The common voltage VICM generated by the analog operational amplifier OPA1 is inputted to the analog operational amplifiers OPA3 and OPA4. The analog operational amplifiers OPA3 and OPA4 may receive audio input signals VINP and VINN (also referred as differential audio input signal pair), and the audio amplification may be adjusted by variable resistors R11-R24. Besides, the analog operational amplifiers OPA3 and OPA4 may output the differential audio output signal pair VOUTP and VOUTN to drive the load 200 and make the load 200 sound. The on/off states of the analog operational amplifiers OPA3 and OPA4 are controlled by the control signal EN5 (or, the on/off states of the core circuits 210 and 214 of the analog operational amplifiers OPA3 and OPA4 are controlled by the control signal EN5).

The switches within the analog operational amplifiers OPA3 and OPA4 are controlled by the control signal EN7. The switches SW1P and SW1N within the analog operational amplifier OPA3 and the switches SW2P and SW2N within the analog operational amplifier OPA4 are controlled by the control signal EN7. In the embodiments of the present disclosure, the switches SW1PB and SW1NB within the analog operational amplifier OPA3 and the switches SW2PB and SW2NB within the analog operational amplifier OPA4 are controlled by the inverse signal (not illustrated) of the control signal EN7.

As indicated in FIG. 2, within the analog operational amplifier OPA3, the non-inverse input end of the core circuit 210 receives the input signal VINP through the resistor R11; the inverse input end of the core circuit 210 receives the input signal VINN through the resistor R12; the inverse input end of the core circuit 210 receives the common voltage VICM through the resistor R21; the output end of the core circuit 210 is coupled to the first bias circuit 212.

The first bias circuit 212 provides a bias voltage to the output stage 214.

The switch SW1P of the output stage 214 is coupled between the first bias circuit 212 and the gate of the MOS transistor MP1. The switch SW1N of the output stage 214 is coupled between the first bias circuit 212 and the gate of the MOS transistor MN1.

The switch SW1PB of the output stage 214 is coupled between the operating voltage VDD and the gate of the MOS transistor MP1. The switch SW1NB of the output stage 214 is coupled between the ground end and the gate of the MOS transistor MN1.

The source of the MOS transistor MP1 is coupled to the operating voltage VDD. The gate is coupled to the switches SW1P and SW1PB. The drain outputs a differential output voltage VOUTP. The source of the MOS transistor MN1 is coupled to the ground end. The gate is coupled to the switches SW1N and SW1NB. The drain outputs the differential output voltage VOUTP.

Similarly, within the analog operational amplifier OPA4, the non-inverse input end of the core circuit 216 receives the input signal VINP through the resistor R13; the non-inverse input end of the core circuit 216 receives the common voltage VICM through the resistor R22; the inverse input end of the core circuit 216 receives the input signal VINN through the resistor R14; the output end of the core circuit 216 is coupled to the second bias circuit 218.

The second bias circuit 218 provides a bias voltage to the output stage 220.

The switch SW2P of the output stage 220 is coupled between the second bias circuit 218 and the gate of the MOS transistor MP2. The switch SW2N of the output stage 220 is coupled between the second bias circuit 218 and the gate of the MOS transistor MN2.

The switch SW2PB of the output stage 220 is coupled between the operating voltage VDD and the gate of the MOS transistor MP2. The switch SW2NB of the output stage 220 is coupled between the ground end and the gate of the MOS transistor MN2.

The source of the MOS transistor MP2 is coupled to the operating voltage VDD; the gate is coupled to the switches SW2P and SW2PB; the drain outputs the differential output voltage VOUTN. The source of the MOS transistor MN2 is coupled to the ground end; the gate is coupled to the switches SW2N and SW2NB; the drain outputs the differential output voltage VOUTN.

The switch SW3 is coupled between the first bias circuit 212 and the second bias circuit 218. The switch SW3 is controlled by the signal VSWB.

The ON/OFF state of the switches SW2A and SW2B is controlled by the control signal EN6. The switch SW2A is coupled between the common voltage VICM and the differential output voltage VOUTN. The switch SW2B is coupled between the common voltage VICM and the differential output voltage VOUTP.

The resistor R23 is coupled between the non-inverse input end of the core circuit 210 and the differential output voltage VOUTP. The resistor R24 is coupled between the inverse input end of the core circuit 216 and the differential output voltage VOUTN.

The operation of the audio system 100 is disclosed below. Refer to FIG. 1 to FIG. 3. The sequence and behavior of the booting procedure and shutdown procedure of the audio system 100 are illustrated in FIG. 3. Prior to the booting procedure, the switches SW3, SW1PB, SW1NB, SW2PB and SW2NB are conducted and the remaining switches are disconnected from each other. The digital analog converter controller 112, the digital analog converter 114, and the analog operational amplifiers OPA1-OPA4 all are disconnected from each other. The input signals VINP and VINN, the analog reference voltage VREF, the common voltage VICM, the switch control voltage VSW, and the differential audio output signal pair VOUTP and VOUTN all have a voltage of 0V.

During the booting procedure, the control signal EN1 is activated to provide power to the digital analog converter controller 112, but the digital encoding signal D1 still has a voltage of 0V. Then, the control signal EN2 is activated to provide power to the digital analog converter 114, but the analog reference voltage VREF still has a voltage of 0V.

Then, the control signal EN3 is activated to provide power to the analog operational amplifier OPA1 to generate a common voltage VICM (a direct current bias voltage). Since the analog reference voltage VREF has a voltage of 0V, the common voltage VICM also maintains at 0V.

When the control signal EN4 is activated, the analog operational amplifier OPA2 may establish a switch control voltage VSW (also maintains at 0V). Since the switch control voltage VSW has a voltage of 0V and the voltage VSWB has a high potential, the switch SW3 is conducted such that the first and the second bias circuits 212 and 218 are short-circuited (such as, the gates of the transistors MP1 and MP2 are connected, and the gates of the transistors MN1 and MN2 are also connected), and the output stages 214 and 220 are also short-circuited. During the booting procedure, the voltage difference between the differential audio output signal pair VOUTN and VOUTP will gradually increase instead of having a big jump, and the pop noises will be reduced.

When the control signal EN5 is activated, internal bias points of the analog operational amplifiers OPA3 and OPA4 may be established (that is, the first and the second bias circuits 212 and 218 both input a voltage of 0V to the transistors MP1 and MP2). Meanwhile, the input signals VINP and VINN, the analog reference voltage VREF, the common voltage VICM, the switch control voltage VSW, and the differential audio output signal pair VOUTP and VOUTN all have a voltage of 0V.

When the control signal EN6 is activated, the common voltage VICM is coupled to the differential audio output signal pair VOUTP and VOUTN (that is, VOUTP=VOUTN=VICM) through the switches SW2A and SW2B. Therefore, the differential audio output signal pair VOUTP and VOUTN outputted by the analog operational amplifiers OPA3 and OPA4 maintains at the same level, and the voltage difference on the load 200 may therefore be reduced or eliminated.

When the control signal EN7 is activated, the switches SW1P, SW1N, SW2P and SW2N are conducted, but the switches SW1PB, SW1NB, SW2PB and SW2NB are disconnected for each other. Thus, the output stages 214 and 220 of the analog operational amplifiers OPA3 and OPA4 may be used to drive the differential audio output signal pair VOUTP and VOUTN.

After that, the digital analog converter controller 112 generates a monotonically increased digital encoding signal D1, and the digital analog converter 114 outputs an analog reference voltage VREF according to the digital encoding signal D1. The analog reference voltage VREF starts to be smoothly increased to a level at which the load 200 may operate normally from the level of 0V.

When the analog reference voltage VREF is smoothly increased, the common voltage VICM outputted by the analog operational amplifier OPA1 starts to be smoothly increased to the required level from the level of 0V.

When the analog reference voltage VREF is smoothly increased, the switch control voltage VSW outputted by the analog operational amplifier OPA2 starts to be smoothly increased to the required level from the level of 0V. When the switch control voltage VSW has a voltage of 0V, the switch SW3 is completely conducted. When the switch control voltage VSW is smoothly increased, the switch SW3 is gradually disconnected. After the switch control voltage VSW reaches the required level, the switch SW3 is completely disconnected. In the embodiments of the present disclosure, during the booting procedure, the internal bias circuits of the analog operational amplifiers OPA3 and OPA4 are short-circuited with each other (when the switch SW3 is conducted), so instant jump in the voltage difference between the differential audio output signal pair VOUTP and VOUTN may be avoided. When the differential audio output signal pair VOUTP and VOUTN reaches the level of the common voltage VICM, the switch SW3 is completely disconnected, and the first and the second bias circuits 212 and 218 are disconnected from each other (that is, the first and the second bias circuits 212 and 218 may be operated independently).

Since the switches SW2A and SW2B are conducted, the differential audio output signal pair VOUTP and VOUTN of the analog operational amplifiers OPA3 and OPA4 are smoothly increased along with the smooth increase of the common voltage VICM.

At time point T1, the control signal EN6 is turned off, such that the common voltage VICM is disconnected from the differential audio output signal pair VOUTP and VOUTN. After the differential audio output signal pair VOUTN and VOUTP reaches the required level, the differential audio output signal pair VOUTN and VOUTP will be limited by the analog operational amplifiers OPA3 and OPA4, and the differential audio output signal pair VOUTN and VOUTP do not need to be coupled to the common voltage VICM through the switches SW2A and SW2B. Therefore, the switches SW2A and SW2B may be disconnected. Thus, the non-inverse/inverse input ends of the analog operational amplifiers OPA3 and OPA4 as well as the differential audio output signal pair VOUTP and VOUTN both have the level of the common voltage VICM. Therefore, before the input signals VINP and VINN are received, no voltages or control signals will change, and the load 200 enters a normal operation mode. Meanwhile, the audio signal 100 may start to receive and output the audio input signals VINP and VINN to the load 200 to play the audio signal.

Similarly, the principles of the shutdown procedure of the audio system 100 are basically opposite to that of the booting procedure. When the audio system 100 is in a normal operation mode, only the switches SW3, SW1PB, SW1NB, SW2PB and SW2NB are disconnected and the remaining switches are all conducted, and the control signals EN1-EN5 and EN7 are activated.

To perform the shutdown procedure, firstly at time point T2, the control signal EN6 changes to the ON state from the OFF state, so that the differential audio output signal pair VOUTP and VOUTN may be coupled to the common voltage VICM. This is because the analog operational amplifiers OPA3 and OPA4 will soon be turned off and lose the drive ability. If the differential audio output signal pair VOUTN and VOUTP is driven by the analog operational amplifiers OPA3 and OPA4 only, the levels of the differential audio output signal pair VOUTN and VOUTP may easily jump and result in pop noises. In the embodiments of the present disclosure, during the shutdown procedure, the control signal EN6 is firstly activated to conduct the switches SW2A and SW2B, such that the differential audio output signal pair VOUTN and VOUTP may be connected to the common voltage VICM. Thus, the signals outputted by the analog operational amplifiers OPA3 and OPA4 may maintain at the same level (VICM), and the voltage difference on the load may therefore be reduced or eliminated.

Moreover, the digital analog converter controller 112, the digital analog converter 114, and the analog operational amplifier OPA1-OPA4 are all in a normal operation mode, but the load 200 no more receives nor outputs the audio signal. Thus, the input signals VINP and VINN and the differential audio output signal pair VOUTP and VOUTN are all at the level (VICM) under normal operation mode.

Then, the digital analog converter controller 112 generates a monotonically decreased digital encoding signal D1, such that the digital analog converter 114 outputs a smoothly decreased analog reference voltage VREF according to the digital encoding signal D1. The analog reference voltage VREF is smoothly decreased to 0V from the level at which the load 200 operates normally.

During the process when the analog reference voltage VREF is smoothly decreased to 0V, the common voltage VICM, the switch control voltage VSW, the non-inverse and inverse input levels VINP and VINN of the analog operational amplifiers OPA3 and OPA4 as well as the differential audio output signal pair VOUTP and VOUTN are also smoothly decreased to 0V. Only when all voltages (VICM, VSW, VINP and VINN, and VOUTP and VOUTN) are decreased to 0V will the analog operational amplifiers OPA3 and OPA4 as well as the differential audio output signal pair VOUTP and VOUTN be turned off from back stages to front stages.

During the shutdown procedure when the switch control voltage VSW is decreased to 0V, the switch SW3 is completely conducted, such that the first and the second bias circuits 212 and 218 are short-circuited with each other, and the voltage difference between the differential audio output signal pair VOUTN and VOUTP will not be too large during the voltage drop procedure.

Then, the control signal EN7 is turned off to disconnect the switches SW1P, SW1N, SW2P and SW2N and to conduct the switches SW1PB, SW1NB, SW2PB and SW2NB. This will incapacitate the output stages 214 and 220 of the analog operational amplifiers OPA3 and OPA4 of the drive ability.

Then, the control signal EN6 is turned off (the switches SW2A and SW2B are disconnected), such that the common voltage VICM is disconnected from the differential audio output signal pair VOUTP and VOUTN. Therefore, the non-inverse/inverse input ends of the analog operational amplifiers OPA3 and OPA4 as well as the differential audio output signal pair VOUTP and VOUTN all have a voltage of 0V.

Then, the control signal EN5 is turned off, such that the core circuits 210 and 216 of the analog operational amplifiers OPA3 and OPA4 are disconnected.

Then, the control signal EN4 and EN3 are sequentially turned off, such that the analog operational amplifiers OPA2 and OPA1 are disconnected.

Then, the control signal EN2 and EN1 are sequentially turned off, such that the digital analog converter 114 and the digital analog converter controller 112 are disconnected.

Thus, the load 200 is completely turned off, and waits for the next booting procedure.

Figure 4:
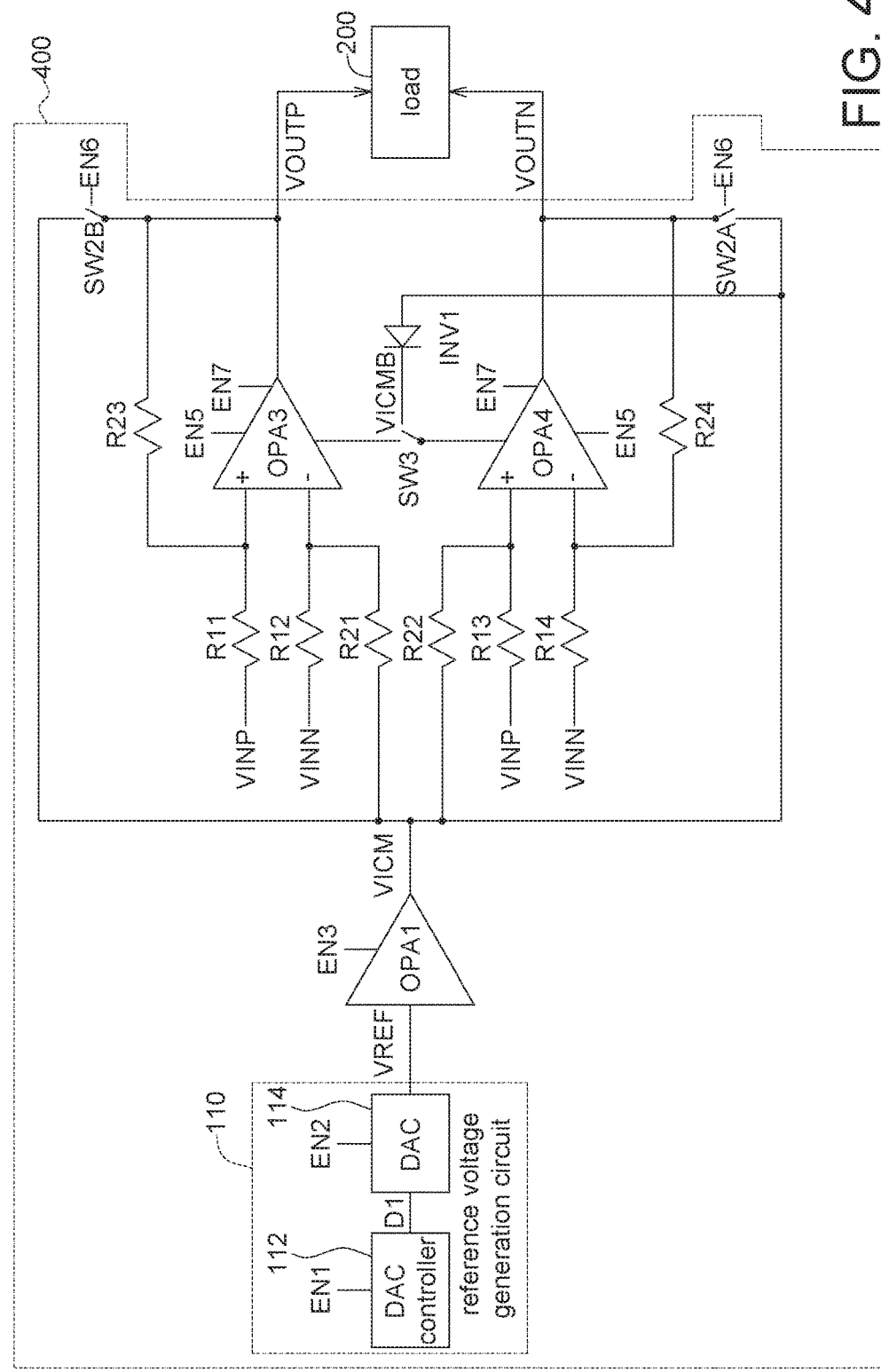
FIG. 4 shows a functional block diagram of an audio system 400 according to another embodiment of the present disclosure.

FIG. 4 shows a functional block diagram of an audio system 400 according to another embodiment of the present disclosure. Unlike FIG. 1, the audio system 400 of FIG. 4 needs neither the analog operational amplifier OPA2 nor the control signal EN4. Therefore, the common voltage VICM outputted by the analog operational amplifier OPA1 is inputted to the phase inverter INV1 to generate a voltage VICMB (for controlling the switch SW3). By controlling the transistor size of the phase inverter INV1, when the common voltage VICM has a voltage of 0V (that is, the voltage VICMB is logic high), the switch SW3 may be completely conducted. When the common voltage VICM is logic high (that is, the voltage VICMB has a voltage of 0V), the switch SW3 may be completely disconnected.

The operating principles of the audio system 400 may be obtained with reference to the operating principles of the audio system 100 of the above embodiments, and are not repeated here.

In the above two embodiments of the present disclosure, no extra capacitors are required, therefore the area and cost for the circuits may be saved.

In above embodiments of the present disclosure, the instant jump in the voltage difference between the differential audio output signal pair VOUTP and VOUTN during the booting procedure or the shutdown procedure is reduced as much as possible such that the pop noises may be reduced or eliminated.

In the embodiments of the present disclosure, during the booting procedure or the shutdown procedure, the analog operational amplifiers OPA3 and OPA4 may counteract instant voltage change of the load 200 through the differential audio output signal pair VOUTP and VOUTN to reduce the pop noises.

In the embodiments of the present disclosure, during the booting procedure, the common voltage VICM is smoothly increased to a maximum from the level of 0V, such that the differential audio output signal pair VOUTN and VOUTP will not suddenly jump to the common voltage VICM form 0V and pop noises may be reduced.

In the embodiments of the present disclosure, the increase and decrease of internal bias voltages (such as VREF, VICM, VOUTP, VOUTN) are smoothed, such that the voltage difference between the differential audio output signal pair VOUTP and VOUTN may be reduced and the pop noises may be accordingly reduced.

Moreover, the embodiments of the present disclosure may control the rise time and drop time of the differential audio output signal pair.

While the invention has been described by way of example and in terms of the embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An audio system, comprising:
   a reference voltage generation circuit to generate a digital encoding signal and to generate an analog reference voltage according to the digital encoding signal, wherein, during a booting procedure and/or a shutdown procedure, the analog reference voltage is smoothly increased and/or decreased at a smooth rate related to a bit number of the digital encoding signal;
   a first analog operational amplifier coupled to the reference voltage generation circuit for receiving the analog reference voltage to generate a common voltage, wherein during the booting procedure and/or the shutdown procedure, the common voltage is smoothly increased and/or decreased; and
   a differential analog operational amplifier pair, coupled to the first analog operational amplifier to receive the common voltage generated by the first analog operational amplifier, for receiving a differential audio input signal pair and outputting a differential output voltage pair to drive a load, wherein during the booting procedure and/or the shutdown procedure, the differential audio output signal pair is smoothly increased and/or decreased,
   wherein, during the booting procedure and/or the shutdown procedure, according to smooth increase or smooth decrease of the analog reference voltage between a first reference level and a second reference level, a plurality of bias circuits of the differential analog operational amplifier pair are transited between being short-circuited to each other and being disconnected from each other.

2. The audio system according to claim 1, further comprising a second analog operational amplifier coupled to the reference voltage generation circuit for receiving the analog reference voltage to generate a switch control voltage,
   wherein, the switch control voltage is for controlling the bias circuits of the differential analog operational amplifier pair to be short-circuited to each other or disconnected from each other.

3. The audio system according to claim 1, wherein, the reference voltage generation circuit comprises:
   a digital analog converter controller configured to generate the digital encoding signal; and
   a digital analog converter coupled to the digital analog converter controller to generate the analog reference voltage according to the digital encoding signal,
   wherein,
   during the booting procedure, the digital analog converter controller generates the monotonically increased digital encoding signal, and the analog reference voltage is smoothly increased; and
   during the shutdown procedure, the digital analog converter controller generates the monotonically decreased digital encoding signal, and the analog reference voltage is smoothly decreased.

4. The audio system according to claim 3, wherein, prior to the booting procedure, the digital analog converter controller, the digital analog converter, the first analog operational amplifier and the differential analog operational amplifier pair all enter a power-off state, and the differential audio input signal pair, the analog reference voltage, the common voltage, and the differential audio output signal pair all have a voltage of 0V.

5. The audio system according to claim 4, wherein, during the booting procedure,
   providing power to the digital analog converter controller, wherein the digital encoding signal has a voltage of 0V;
   providing power to the digital analog converter, wherein the analog reference voltage is 0V;
   providing power to the first analog operational amplifier to generate the common voltage, which maintains at 0V;
   providing power to the differential analog operational amplifier pair to create a plurality of internal bias points, wherein the differential audio output signal pair has a voltage of 0V;
   coupling the common voltage to the differential audio output signal pair, such that the differential audio output signal pair maintains at the same level;
   driving the differential audio output signal pair by a plurality of output stages of the analog operational amplifier pair;
   generating the monotonically increased digital encoding signal by the digital analog converter controller, such that the digital analog converter outputs the analog reference voltage according to the digital encoding signal, and the analog reference voltage starts to be smoothly increased;
   when the analog reference voltage is smoothly increased, the common voltage outputted by the first analog operational amplifier starts to be smoothly increased;
   the differential audio output signal pair outputted by the analog operational amplifier pair is smoothly increased along with the smooth increase of the common voltage; and
   disconnecting the common voltage from the differential audio output signal pair, such that the differential audio output signal pair is limited by the differential analog operational amplifier pair.

6. The audio system according to claim 5, wherein, during the shutdown procedure,
   coupling the differential audio output signal pair to the common voltage;
   generating the monotonically decreased digital encoding signal by the digital analog converter controller, such that the digital analog converter outputs the smoothly decreased analog reference voltage according to the digital encoding signal, wherein when the analog reference voltage is smoothly decreased to 0V, the common voltage and the differential audio output signal pair are also smoothly decreased to 0V;
   incapacitating the output stages of the differential analog operational amplifier pair of drive ability;
   disconnecting the common voltage from the differential audio output signal pair;
   making a plurality of core circuits of the differential analog operational amplifier pair to enter a power-off state;
   making the first analog operational amplifier to enter a power-off state; and making the digital analog converter and the digital analog converter controller to enter a power-off state.

\* \* \* \* \*